United States Patent [19]

Suzuki et al.

[11] 4,270,216

[45] May 26, 1981

[54] TUNING AND VOLUME INDICATOR

[75] Inventors: Tadahiko Suzuki, Yokohama; Yasunari Ikeda, Funabashi, both of Japan

[73] Assignee: Sony Corporation, Tokyo, Japan

[21] Appl. No.: 75,491

[22] Filed: Sep. 13, 1979

[30] Foreign Application Priority Data

Sep. 19, 1978 [JP] Japan .................. 53-128488[U]

[51] Int. Cl.³ .................................... H04B 1/16
[52] U.S. Cl. ........................... 455/159; 330/2; 455/200; 455/232
[58] Field of Search ............... 455/154, 155, 157–159, 455/177, 200, 232; 358/192.1; 330/2

[56] References Cited

U.S. PATENT DOCUMENTS

| 2,064,462 | 12/1936 | Craig et al. | 455/155 |
| 2,808,467 | 10/1957 | Baumgartner | 455/159 |
| 3,835,424 | 9/1974 | Marik | 455/158 |
| 4,087,793 | 5/1978 | Lucas | 455/232 |
| 4,137,502 | 1/1979 | Maddaloni | 455/159 |

*Primary Examiner*—Marc E. Bookbinder
*Attorney, Agent, or Firm*—Lewis H. Eslinger; Alvin Sinderbrand

[57] ABSTRACT

An indicator is responsive to a gain control voltage applied to an amplifier for indicating the gain of the amplifier irrespective of amplitude of the signal being amplified. The amplifier may be an audio amplifier in a television receiver which also contains an electronic tuner tuned by a tuning voltage, in which case, the indicator may alternatively indicate the tuning voltage while a television channel is being preset and the gain of the audio amplifier at other times.

7 Claims, 3 Drawing Figures

TUNING AND VOLUME INDICATOR

BACKGROUND OF THE INVENTION

The present invention relates generally to a tuning and volume indicator, and is directed more particularly to a tuning and volume indicator for use with a television receiver having an electronic tuning tuner.

It is conventional to employ audio volume indicators which indicate the amplitude of an audio output signal applied to a loudspeaker. When such an indicator is relied on for adjusting a volume control, there is no way for the user to tell whether the sound volume is due to correct adjustment of the volume control or incorrect adjustment of the volume control with an unusually loud or soft broadcast audio signal. In the latter case, once the broadcast audio signal returns to a more normal value, the volume control must be readjusted. Such necessity for readjustment is inconvenient.

Television receivers are also known in which tuning is performed by an electronic tuner in response to a tuning control voltage applied thereto, and further in which such tuning control voltage may be indicated by a tuning indicator.

OBJECTS AND SUMMARY OF THE INVENTION

An object of the present invention is to provide a novel tuning and volume indicator.

Another object of the invention is to provide a tuning and volume indicator suitable for use with a television receiver having an electronic tuner.

A further object of the invention is to provide a tuning and volume indicator in which a display system displays a channel preset voltage when a channel is being preset and displays a volume control voltage at other times.

A further object of the invention is to provide a tuning and volume indicator in which the sound volume can be adjusted accurately by reference to a displayed sound volume control voltage.

According, in an electronic apparatus, such as, a receiver, having at least an amplifier with a variable gain for amplifying a signal, the present invention provides means for generating a gain control voltage proportional to a desired gain of the amplifier, means in the amplifier for controlling the gain in response to the gain control voltage and display means for displaying the gain control voltage.

According to a feature of the invention, when the electronic apparatus is in the form of a receiver provided with an electronic tuner for tuning a signal which has at least an audio component, means for generating a tuning voltage proportional to a desired signal, and means in the electronic tuner responsive to the tuning voltage for tuning the desired signal; the amplifier having a variable gain acts on the audio component in the desired signal, and the display means alternatively displays the tuning voltage or the volume or gain control voltage.

The above, and other features, objects and advantages of the present invention, will become apparent from the following description read in conjunction with the accompanying drawings in which like reference numerals designate the same elements.

DETAILED DESCRIPTION OF THE PREFERRED EMBODIMENT

Figure 1:
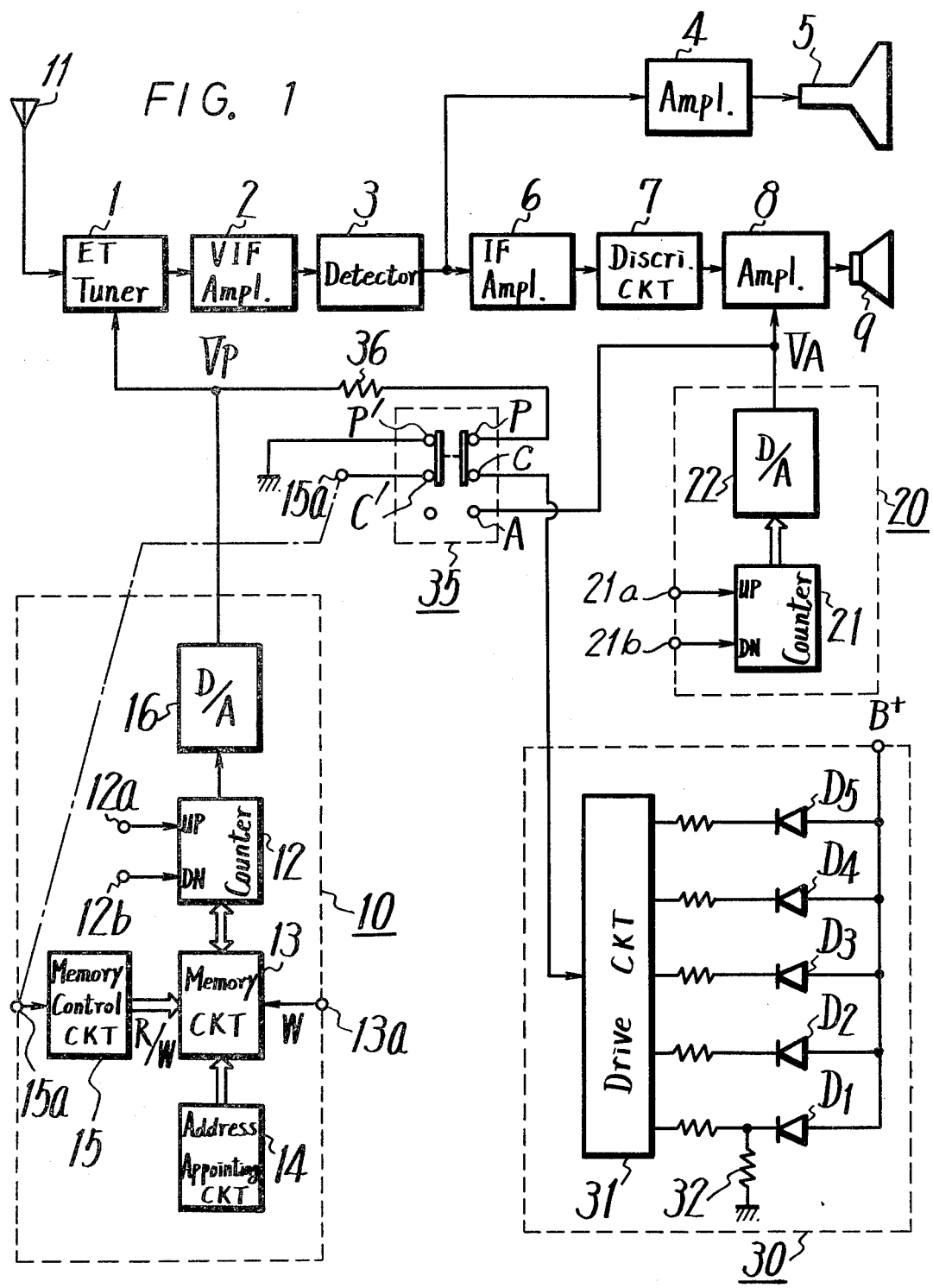
FIG. 1 is a block diagram showing a tuning and volume control indicator according to an embodiment of the present invention.

Referring now to FIG. 1, an electronic tuner 1 receives radio frequency signals from an antenna 11 and provides a tuned output to a video intermediate frequency amplifier 2. The output signal from video intermediate frequency amplifier 2 is applied to a video detector 3 whose output signal is applied, in turn, through a video amplifier 4 to a cathode ray tube 5 of a television receiver. The output signal from video detector 3 is also applied through a sound intermediate frequency amplifier 6, a discriminator circuit 7 and an audio amplifier 8 to a speaker 9. Audio amplifier 8 is a voltage controlled amplifier whose gain is controlled by a control voltage applied thereto as will be explained.

A channel preset circuit 10, which also serves as a channel selection circuit, contains an up-down counter 12 which selectively receives inputs at an UP-count terminal 12a and a DOWN-count terminal 12b, respectively. Control signals selectively applied to the terminals 12a and 12b are provided by conventional means such as by UP and DOWN switches (not shown). Channel preset circuit 10 also contains a memory circuit 13, an address appointing circuit 14, which may be associated with a channel selecting button (not shown), and a memory control circuit 15. Memory control circuit 15 controls writing and reading in memory circuit 13. A writing pulse W, which is produced in a well known manner following operation of the UP and DOWN switches, is applied through a writing pulse input terminal 13a to memory circuit 13. Channel preset circuit 10 includes a D/A converter 16 which receives and D/A converts the output from up-down counter 12 to produce a channel preset voltage $V_p$. Channel preset voltage $V_p$ is applied to electronic tuner 1. Channel preset voltage $V_p$ is also employed as a channel selecting voltage after a channel is preset.

A sound volume adjusting circuit 20 contains an up-down counter 21 and a D/A converter 22. Up-down counter 21 is controlled to increase or decrease a number or count stored therein in response to control signals from a sound volume adjusting button (not shown) or a remote control signal which selectively produces a volume UP control signal applied to UP terminal 21a or a volume DOWN control signal applied to DOWN terminal 21b. The number or count in up-down counter 21 is D/A converted to an analog sound volume control voltage $V_A$ by D/A converter 22. Sound volume control voltage $V_A$ is applied to a control terminal of audio amplifier 8 to control the gain thereof.

A display circuit 30 includes a plurality of display elements such as, for example, light emitting diodes $D_1$ to $D_5$ which are effective to selectively display channel preset voltage $V_p$ or sound volume control voltage $V_A$. A conventional drive circuit 31, which may include four or five level discriminating or detecting circuits for detecting appropriate input voltage levels, controls the illumination of corresponding ones of the five light emitting diodes $D_1$ to $D_5$. A bias resistor 32 is preferably connected to light emitting diode $D_1$ so that it is always lit regardless of the input voltage to drive circuit 31.

A mode change switch 35 is preferably a double-pole double-throw switch, which may be a slide switch as illustrated, having a common terminal C selectively connectable to terminals P and A and a common terminal C' selectively connectable to a terminal P'. When mode change switch 35 is placed in its preset position, terminals P' and C' and terminals P and C are connected together respectively as shown in FIG. 1. A ground signal, or binary "0", fed through contacts P' and C' to input terminal 15a of channel preset circuit 10, places memory control circuit 15 in the write mode. Channel preset voltage $V_p$ is fed through a voltage adjusting resistor 36 and closed contacts P and C of mode change switch 35 to drive circuit 31 in display circuit 30. Light emitting diodes $D_1$ to $D_5$ are appropriately illuminated and extinguished in response to channel preset voltage $V_p$ to indicate the channel to which electronic tuner 1 is tuned.

When mode change switch 35 is placed in its channel select position, which is opposite to the position shown in FIG. 1, sound volume control voltage $V_A$ is applied through contacts C and A thereof to the input of drive circuit 31 to replace channel preset voltage $V_p$ previously displayed. Thus, display circuit 30 displays channel preset voltage $V_p$ while one or more channels are being preset and displays sound volume control voltage $V_A$ at all other times. Voltage adjusting resistor 36 compensates for differences in range between channel preset voltage $V_p$ and sound volume control voltage $V_A$ to establish the proper display ranges for the two voltages.

Thus, channel preset voltage $V_p$ and sound volume control voltage $V_A$ are alternatively displayed by a single display circuit 30 so that the circuit construction is simplified and display circuit 30 is used more effectively. That is, since display of channel preset voltage $V_p$ is useful only when a channel is being preset and is not needed until the next time a channel is to be preset, display circuit 30 is available for displaying sound volume control voltage $V_A$ without requiring a separate display circuit.

Common terminal C' is disconnected from grounded terminal P' when the mode change switch 35 is placed in its channel select position and thus removes the ground or binary "0" from input terminal 15a of memory control circuit 15. This terminates the write mode in channel preset circuit 10.

Figure 2:
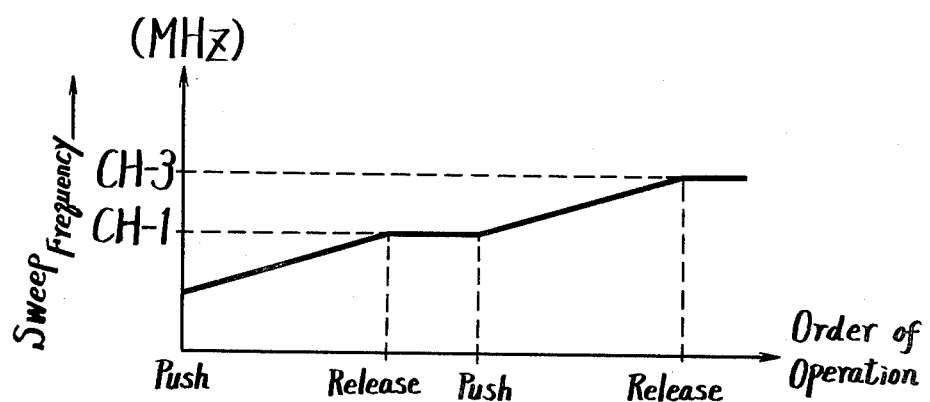
FIG. 2 is a graph to which reference will be made in explaining channel presetting using the embodiment of the invention shown in FIG. 1.

Referring now to FIG. 2, when the UP switch (not shown) is operated to apply an appropriate input to UP count terminal 12a, up-down counter 12 is driven in a direction to sweep the received frequency in the increasing direction. When the received frequency coincides with a desired channel, for example, channel 2, the UP switch may be released. Channel preset voltage $V_p$ is thus fixed at a voltage which tunes channel 2. A writing pulse W is applied to writing pulse input terminal 13a. Writing pulse W causes the storage of the content or number then existing in up-down counter 12 in memory circuit 13 at an address determined by address appointing circuit 14. Channel presetting may be carried out to tune and store counts corresponding to additional desired channels by repeating the above procedure. As is well known in the art, any one of a plurality of such preset channels can be selected by address appointing circuit 14 and a channel selecting voltage equal to channel preset voltage $V_p$ corresponding thereto is applied to electronic tuner 1 for tuning the selected stored channel.

Figure 3:
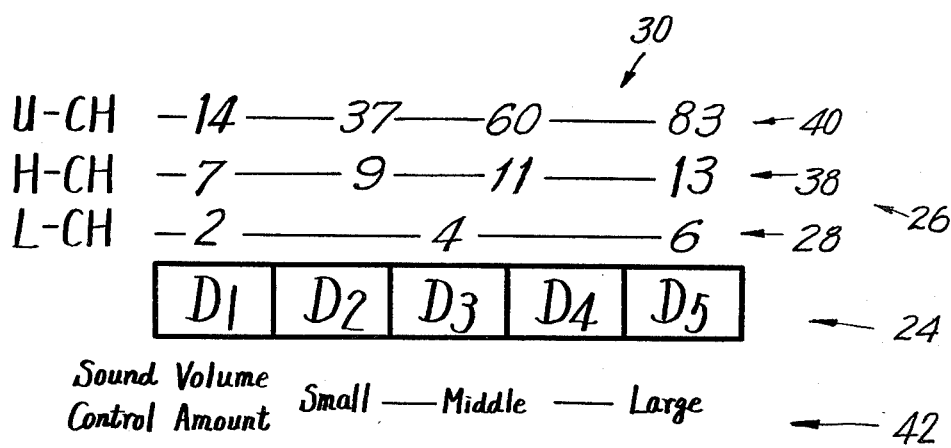
FIG. 3 is a schematic diagram to which reference will be made in explaining the operation of the display circuit used in the embodiment of the invention shown in FIG. 1.

Referring now to FIG. 3, one embodiment of display circuit 30 with tuning and sound volume explanatory indicia is shown. Light emitting diodes $D_1$ to $D_5$ form a bar display 24 which may be sequentially illuminated, for example, from left to right, to produce a lighted bar continuously illuminated from the extreme left to a position toward the extreme right which indicates the desired information. Alternatively, only one of light emitting diodes $D_1$–$D_5$ may be illuminated at a time.

A channel indicator panel 26 adjacent bar display 24 identifies the television channel being tuned during the preset mode. Channel indicator panel 26 includes a low channel portion 28 for channels 2–6, a high channel portion 38 for high channels 7–13 and an ultra high channel portion 40 for UHF channels 14–83. The portion being used during the channel preset mode may be indicated by the illumination of an indicator lamp (not shown) in channel indicator 26. Alternatively, the operator will perceive the proper portion to be used by correlation with the particular channel select switches (not shown) being manipulated.

A sound volume control voltage indicator panel 42 is also provided adjacent bar display 24. In the channel select mode, sound volume control voltage indicator panel 42 is employed with bar display 24 to indicate the gain setting of the audio amplifier 8 (FIG. 1).

The use of sound volume control indicator panel 42 in the present invention is roughly equivalent to setting the sound volume according to the rotary position of a volume control knob. Even when the broadcast sound volume is unusually loud or soft, if the adjustment is made by reference to the rotary position of the volume control knob, when the broadcast sound returns to its normal value, the reproduced sound also returns to its normal value. A similar result is achieved by displaying sound volume control voltage $V_A$. The gain of audio amplifier 8 may therefore be set to the proper level independently of the softness or loudness of the broadcast sound.

Although bar display 24 using sequentially illuminated light emitting diodes $D_1$–$D_5$ is employed in the preferred embodiment, it should be understood that any other suitable display device such as, for example, incandescent or gas-filled lamps or galvanometer displays may be substituted therefor without departing from the scope of the invention.

Having described specific preferred embodiments of the invention with reference to the accompanying drawings, it is to be understood that the invention is not limited to these precise embodiments, and that various changes and modifications may be effected therein by one skilled in the art without departing from the scope or spirit of the invention as defined in the appended claims.

What is claimed is:

1. An electronic apparatus included in a television receiver, comprising means for tuning a television signal including means for generating a tuning control voltage corresponding to a desired television channel, said means for tuning including means for presetting a television signal, means for selecting a television signal, means for selectively operating alternatively said means for presetting and said means for selecting; an audio amplifier having an adjustable gain for amplifying an audio signal; means for generating a gain control voltage for establishing a desired gain of said audio amplifier; display means for displaying said gain control voltage; and means for alternatively applying said tuning control voltage to said display means in place of said gain control voltage, said means for alternatively applying being responsive to operation of said means for presetting to display said tuning control voltage and being further responsive to operation of said means for selecting to display said gain control voltage.

2. A receiver for receiving one of a plurality of signals containing at least an audio component, comprising:
   an electronic tuner for tuning one of said signals;
   means for generating a tuning voltage proportional to a desired signal of said plurality of signals; said means for generating a tuning voltage including a preset mode and a channel select mode;
   means in said electronic tuner responsive to said tuning voltage for tuning said desired signal;
   amplifying means having a gain for amplifying said audio component in said desired signal;
   means for generating a volume control voltage proportional to a desired value of said gain;
   means in said amplifying means for controlling said gain to a desired value in response to said volume control voltage; and
   display means for alternatively displaying said tuning voltage and said volume control voltage, said display means being operative during said preset mode of said means for generating for displaying said tuning voltage and operative during said channel select mode of said means for generating for displaying said volume control voltage.

3. Electronic tuning apparatus comprising electronic tuning means responsive to a tuning voltage supplied thereto for exhibiting a tuning condition established by said tuning voltage to receive information broadcast on a corresponding broadcast channel; tuning voltage generating means for generating a tuning voltage to select the broadcast channel to which said electronic tuning means is to be tuned, the generated tuning voltage being supplied to said electronic tuning means; means for recovering the information which has been received on the broadcast channel selected by said generated tuning voltage; gain controllable amplifier means for amplifying the recovered information by an amount established by a gain control voltage supplied thereto; gain control voltage generating means for generating a gain control voltage to select the gain of said gain controllable amplifier means, the generated gain control voltage being supplied to said gain controllable amplifier means; common display means for visually displaying an indication of the relative magnitude of a voltage supplied thereto; and mode change switch means having a first condition for coupling said tuning voltage to said common display means, whereby an indication of the broadcast channel to which said electronic tuning means is tuned is displayed, said mode change switch means having a second condition for coupling said gain control voltage to said common display means, whereby an indication of the gain of said gain controllable amplifier means is displayed.

4. An electronic tuning apparatus according to claim 3; wherein said common display means includes a plurality of light emitting elements and means for selectively energizing a number of said light emitting elements in proportion to said tuning or gain control voltage coupled thereto.

5. An electronic tuning apparatus according to claim 3; wherein said gain controllable amplifier means is an audio amplifier and said recovered information is an audio signal.

6. An electronic tuning apparatus according to claim 3; wherein said electronic tuning means includes:
   a counter operative to produce a changeable digital number; and
   a D/A converter operative to produce said tuning control voltage in response to said digital number.

7. An electronic tuning apparatus according to claim 6; wherein said electronic tuning means further includes:
   means for storing at least one stored value of said digital number; and
   means for supplying said at least one stored value to said D/A converter for tuning a corresponding television signal.

* * * * *